(12) United States Patent
Papaefthymiou et al.

(10) Patent No.: US 8,593,183 B2
(45) Date of Patent: Nov. 26, 2013

(54) ARCHITECTURE FOR CONTROLLING CLOCK CHARACTERISTICS

(75) Inventors: Marios C. Papaefthymiou, Ann Arbor, MI (US); Alexander Ishii, Princeton, NJ (US)

(73) Assignee: Cyclos Semiconductor, Inc., Berkeley, CA (US)

( * ) Notice: Subject to any disclaimer, the term of this patent is extended or adjusted under 35 U.S.C. 154(b) by 0 days.

(21) Appl. No.: 12/903,158

(22) Filed: Oct. 12, 2010

(65) Prior Publication Data

US 2011/0084736 A1  Apr. 14, 2011

Related U.S. Application Data

(60) Provisional application No. 61/250,830, filed on Oct. 12, 2009.

(51) Int. Cl.
*H03K 3/00* (2006.01)

(52) U.S. Cl.
USPC ............................ 327/108; 327/175; 327/295

(58) Field of Classification Search
USPC .......................................... 327/108, 175, 295
See application file for complete search history.

(56) References Cited

U.S. PATENT DOCUMENTS

| | | |
|---|---|---|
| 4,611,135 A | 9/1986 | Nakayama et al. |
| 5,023,480 A | 6/1991 | Gieseke et al. |
| 5,036,217 A | 7/1991 | Rollins et al. |
| 5,111,072 A | 5/1992 | Seidel |
| 5,122,679 A | 6/1992 | Ishii et al. |
| 5,146,109 A | 9/1992 | Martignoni et al. |
| 5,311,071 A | 5/1994 | Ueda |
| 5,332,916 A | 7/1994 | Hirai |
| 5,384,493 A | 1/1995 | Furuki |
| 5,396,527 A | 3/1995 | Schlecht et al. |
| 5,410,491 A | 4/1995 | Minami |
| 5,430,408 A | 7/1995 | Ovens et al. |
| 5,473,526 A | 12/1995 | Svensson et al. |
| 5,489,866 A | 2/1996 | Diba |
| 5,504,441 A | 4/1996 | Sigal |

(Continued)

FOREIGN PATENT DOCUMENTS

| | | |
|---|---|---|
| EP | 0953892 | 11/1999 |
| EP | 1126612 | 8/2001 |

(Continued)

OTHER PUBLICATIONS

International Search Report and Written Opinion issued in PCT/US2010/052393 on Jun. 23, 2011.

(Continued)

*Primary Examiner* — Ryan Jager
(74) *Attorney, Agent, or Firm* — Sheppard, Mullin, Richter & Hampton LLP

(57) ABSTRACT

An architecture for controlling the clock waveform characteristics, including but not limited to the clock amplitude and clock rise and/or fall times, of resonant clock distribution networks is proposed. This architecture relies on controlling the size of clock drivers and the duty cycles of reference clocks. It is targeted at resonant clock distribution networks and allows for the adjustment of resonant clock waveform characteristics with no need to route an additional power grid. Such an architecture is generally applicable to semiconductor devices with multiple clock frequencies, and high-performance and low-power clocking requirements such as microprocessors, ASICs, and SOCs.

17 Claims, 9 Drawing Sheets

(56) References Cited

U.S. PATENT DOCUMENTS

| | | | |
|---|---|---|---|
| 5,506,520 | A | 4/1996 | Frank et al. |
| 5,506,528 | A | 4/1996 | Cao et al. |
| 5,508,639 | A | 4/1996 | Fattaruso |
| 5,517,145 | A | 5/1996 | Frank |
| 5,517,399 | A | 5/1996 | Yamauchi et al. |
| 5,526,319 | A | 6/1996 | Dennard et al. |
| 5,537,067 | A | 7/1996 | Carvajal et al. |
| 5,559,463 | A | 9/1996 | Denker et al. |
| 5,559,478 | A | 9/1996 | Athas et al. |
| 5,587,676 | A | 12/1996 | Chowdhury |
| 5,675,263 | A | 10/1997 | Gabara |
| 5,701,093 | A | 12/1997 | Suzuki |
| 5,734,285 | A | 3/1998 | Harvey |
| 5,760,620 | A | 6/1998 | Doluca |
| 5,838,203 | A | 11/1998 | Stamoulis et al. |
| 5,841,299 | A | 11/1998 | De |
| 5,872,489 | A | 2/1999 | Chang et al. |
| 5,892,387 | A | 4/1999 | Shigehara et al. |
| 5,896,054 | A | 4/1999 | Gonzalez |
| 5,970,074 | A | 10/1999 | Ehiro |
| 5,986,476 | A | 11/1999 | De |
| 5,999,025 | A | 12/1999 | New |
| 6,009,021 | A | 12/1999 | Kioi |
| 6,009,531 | A | 12/1999 | Selvidge et al. |
| 6,011,441 | A | 1/2000 | Ghoshal |
| 6,037,816 | A | 3/2000 | Yamauchi |
| 6,052,019 | A | 4/2000 | Kwong |
| 6,069,495 | A | 5/2000 | Ciccone et al. |
| 6,091,629 | A | 7/2000 | Osada et al. |
| 6,150,865 | A | 11/2000 | Fluxman et al. |
| 6,160,422 | A | 12/2000 | Huang |
| 6,169,443 | B1 | 1/2001 | Shigehara et al. |
| 6,177,819 | B1 | 1/2001 | Nguyen |
| 6,230,300 | B1 | 5/2001 | Takano |
| 6,242,951 | B1 | 6/2001 | Nakata et al. |
| 6,278,308 | B1 | 8/2001 | Partovi et al. |
| 6,323,701 | B1 | 11/2001 | Gradinariu et al. |
| RE37,552 | E | 2/2002 | Svensson et al. |
| 6,433,586 | B2 | 8/2002 | Ooishi |
| 6,438,422 | B1 | 8/2002 | Schu et al. |
| 6,477,658 | B1 | 11/2002 | Pang |
| 6,538,346 | B2 | 3/2003 | Pidutti et al. |
| 6,542,002 | B2 | 4/2003 | Jang et al. |
| 6,559,681 | B1 | 5/2003 | Wu et al. |
| 6,563,362 | B2 | 5/2003 | Lambert |
| 6,608,512 | B2 | 8/2003 | Ta et al. |
| 6,720,815 | B2 | 4/2004 | Mizuno |
| 6,742,132 | B2 | 5/2004 | Ziesler et al. |
| 6,777,992 | B2 | 8/2004 | Ziesler et al. |
| 6,856,171 | B1 | 2/2005 | Zhang |
| 6,879,190 | B2 | 4/2005 | Kim et al. |
| 6,882,182 | B1 | 4/2005 | Conn et al. |
| 7,005,893 | B1 | 2/2006 | Athas et al. |
| 7,145,408 | B2 | 12/2006 | Shepard et al. |
| 7,215,188 | B2 | 5/2007 | Ramaraju et al. |
| 7,227,425 | B2 | 6/2007 | Jang et al. |
| 7,233,186 | B2 * | 6/2007 | Ishimi .......................... 327/291 |
| 7,301,385 | B2 | 11/2007 | Takano et al. |
| 7,307,486 | B2 | 12/2007 | Pernia et al. |
| 7,355,454 | B2 | 4/2008 | Papaefthymiou et al. |
| 7,567,110 | B2 | 7/2009 | Shionoya |
| 7,622,997 | B2 | 11/2009 | Papaefthymiou et al. |
| 7,696,734 | B2 | 4/2010 | Endo et al. |
| 7,719,316 | B2 | 5/2010 | Chueh et al. |
| 7,719,317 | B2 | 5/2010 | Chueh et al. |
| 7,956,664 | B2 | 6/2011 | Chueh et al. |
| 7,973,565 | B2 | 7/2011 | Ishii et al. |
| 8,089,323 | B2 | 1/2012 | Tarng et al. |
| 8,237,484 | B2 | 8/2012 | Kaviani et al. |
| 8,350,632 | B1 | 1/2013 | Kim |
| 2001/0013795 | A1 | 8/2001 | Nojiri |
| 2002/0140487 | A1 | 10/2002 | Fayneh et al. |
| 2003/0189451 | A1 | 10/2003 | Ziesler et al. |
| 2005/0057286 | A1 | 3/2005 | Shepard et al. |
| 2005/0088231 | A1 | 4/2005 | Ziegler |
| 2005/0114820 | A1 | 5/2005 | Restle |
| 2006/0082387 | A1 | 4/2006 | Papaefthymiou et al. |
| 2006/0152293 | A1 | 7/2006 | McCorquodale et al. |
| 2007/0096957 | A1 | 5/2007 | Papaefthymiou et al. |
| 2007/0168786 | A1 | 7/2007 | Drake et al. |
| 2007/0216462 | A1 * | 9/2007 | Ishimi .......................... 327/291 |
| 2008/0136473 | A1 * | 6/2008 | You et al. ....................... 327/161 |
| 2008/0150605 | A1 * | 6/2008 | Chueh et al. ................... 327/292 |
| 2008/0150606 | A1 | 6/2008 | Kumata |
| 2008/0164921 | A1 * | 7/2008 | Shin .............................. 327/158 |
| 2008/0303576 | A1 * | 12/2008 | Chueh et al. ................... 327/299 |
| 2009/0027085 | A1 * | 1/2009 | Ishii et al. ......................... 326/93 |
| 2011/0084736 | A1 * | 4/2011 | Papaefthymiou et al. .... 327/108 |
| 2011/0084772 | A1 * | 4/2011 | Papaefthymiou et al. .... 331/117 FE |
| 2011/0084773 | A1 * | 4/2011 | Papaefthymiou et al. .... 331/117 FE |
| 2011/0084774 | A1 * | 4/2011 | Papaefthymiou et al. .... 331/117 FE |
| 2011/0084775 | A1 * | 4/2011 | Papaefthymiou et al. .... 331/117 FE |
| 2011/0090018 | A1 * | 4/2011 | Papaefthymiou et al. .... 331/117 FE |
| 2011/0090019 | A1 * | 4/2011 | Papaefthymiou et al. .... 331/117 FE |
| 2011/0109361 | A1 * | 5/2011 | Nishio .......................... 327/170 |
| 2011/0140753 | A1 * | 6/2011 | Papaefthymiou et al. .... 327/291 |
| 2011/0210761 | A1 * | 9/2011 | Ishii et al. ......................... 326/93 |
| 2011/0215854 | A1 * | 9/2011 | Chueh et al. ................... 327/292 |

FOREIGN PATENT DOCUMENTS

| | | |
|---|---|---|
| EP | 1764669 | 3/2007 |
| JP | 63246865 | 10/1988 |
| JP | 7321640 A | 12/1995 |
| JP | 3756285 | 1/2006 |
| WO | 2005092042 | 10/2005 |

OTHER PUBLICATIONS

Sathe, Visvesh S., et al. "Resonant-Clock Latch-Based Design," IEEE Journal of Solid-State Circuits, Apr. 2008, pp. 864-873, vol. 32, No. 4, IEEE.

Athas et al., "Low-Power Digital Systems Based on Adiabatic-Switching Principles," IEEE Transactions on Very Large Scale Integration (VLSI) Systems, vol. 2, No. 4, pp. 398-407, Dec. 1994.

Chan et al., "1.1 to 1.6GHz Distributed Differential Oscillator Global Clock Network," International Solid-State Circuits Conference, pp. 518-519, Feb. 9, 2005.

Chan et al., "A 4.6GHz Resonant Global Clock Distribution Network," IEEE International Solid-State Circuits Conference, Feb. 18, 2004.

Chan et al., "A Resonant Global Clock Distribution for the Cell Broadband Engine Processor," IEEE Journal of Solid State Circuits, vol. 44, No. 1, pp. 64-72, Jan. 2009.

Chan et al., "Design of Resonant Global Clock Distributions," Proceedings of the 21st International Conference on Computer Design, pp. 248-253, Oct. 2003.

Chueh et al., "900MHz to 1.2GHz Two-Phase Resonant Clock Network with Programmable Driver and Loading," IEEE Custom Integrated Circuits Conference, pp. 777-780, Sep. 2006.

Chueh et al., "Two-Phase Resonant Clock Distribution," Proceedings of the IEEE Computer Society Annual Symposium on VLSI: New Frontiers on VLSI Design, May 2005.

Cooke et al., "Energy Recovery Clocking Scheme and Flip-Flops for Ultra Low-Energy Application," International Symposium on Low-Power Electronic Design, pp. 54-59, Aug. 25-27, 2003.

Drake et al., "Resonant Clocking Using Distributed Parasitic Capacitance," IEEE Journal of Solid-State Circuits, vol. 39, No. 9, pp. 1520-1528, Sep. 2004.

Dunning, Jim, "An All-Digital Phase-Locked Loop with 50-Cycle Lock Time Suitable for High-Performance Microprocessors," IEEE Journal of Solid-State Circuits, vol. 30, No. 4, pp. 412-422, Apr. 1995.

(56) References Cited

OTHER PUBLICATIONS

Fang et al., "A High-Performance Asynchronous FPGA: Test Results," Proceedings of the 13th Annual IEEE Symposium on Field-Programmable Custom Computing Machines, Apr. 2005.
Favalli et al., "Testing Scheme for IC's Clocks," IEEE European Design and Test Conference, Mar. 1997.
Gutnik et al., "Active GHz Clock Network Using Distributed PLLs," IEEE Journal of Solid-State Circuits, vol. 35, No. 11, pp. 1553-1560, Nov. 2000.
Ishii et al., "A Resonant-Clock 200MHz ARM926EJ-S(TM) Microcontroller," European Solid-State Circuits Conference, Sep. 2009.
Kim et al., "Energy Recovering Static Memory," Proceedings of the 2002 International Symposium on Low Power Electronics and Design, pp. 92-97, Aug. 12-14, 2002.
Maksimovic et al., "Design and Experimental Verification of a CMOS Adiabatic Logic with Single-Phase Power-Clock Supply," Proceedings of the 40th Midwest Symposium on Circuits and Systems, pp. 417-420, Aug. 1997.
Maksimovic et al., "Integrated Power Clock Generators for Low Energy Logic," IEEE Annual Power Electronics Specialists Conference, vol. 1, pp. 61-67, Jun. 18-22, 1995.
Moon et al., "An Efficient Charge Recovery Logic Circuit," IEEE Journal of Solid-State Circuits, vol. 31, No. 4, pp. 514-522, Apr. 1996.
Sathe et al., "A 0.8-1.2GHz Frequency Tunable Single-Phase Resonant-Clocked FIR Filter with Level-Sensitive Latches," IEEE 2007 Custom Integrated Circuits Conference, pp. 583-586, Sep. 2007.
Sathe et al., "A 1.1GHz Charge-Recovery Logic," IEEE International Solid-State Circuits Conference, Feb. 7, 2006.
Sathe et al., "A 1GHz Filter with Distributed Resonant Clock Generator," IEEE Symposium on VLSI Circuits, pp. 44-45, Jun. 2007.
Teifel et al., "Highly Pipelined Asynchronous FPGAs," Proceedings of the 2004 ACM/SIGDA 12th International Symposium on Field Programmable Gate Arrays, pp. 133-142, Feb. 22-24, 2004.
Weste et al., "Principles of CMOS VLSI Design: A Systems Perspective," 2nd Edition, Addison-Wesley, pp. 9-11, 1992.
Ziesler et al., "A 225 MHz Resonant Clocked ASIC Chip," Proceedings of the 2003 International Symposium on Low Power Electronics and Design, pp. 48-53, Aug. 25-27, 2003.
Ziesler et al., "A Resonant Clock Generator for Single-Phase Adiabatic Systems," Proceedings of the 2001 International Symposium on Low Power Electronics and Design, pp. 159-164, Aug. 6-7, 2001.
Ziesler et al., "Energy Recovering ASIC Design," Proceedings of the IEEE Computer Society Annual Symposium on VLSI, Feb. 20-21, 2003.
Search Report and Written Opinion from International Serial No. PCT/US2007/086304 mailed Mar. 3, 2009.
Search Report and Written Opinion from International Serial No. PCT/US2008/064766 mailed Dec. 22, 2008.
Search Report and Written Opinion from International Serial No. PCT/US2010/052390 mailed Jun. 23, 2011.
Search Report and Written Opinion from International Serial No. PCT/US2010/052395 mailed Jun. 23, 2011.
Search Report and Written Opinion from International Serial No. PCT/US2010/052396 mailed Jun. 23, 2011.
Search Report and Written Opinion from International Serial No. PCT/US2010/052397 mailed Jun. 23, 2011.
Search Report and Written Opinion from International Serial No. PCT/US2010/052401 mailed Jun. 29, 2011.
Search Report and Written Opinion from International Serial No. PCT/US2010/052402 mailed Jun. 23, 2011.
Search Report and Written Opinion from International Serial No. PCT/US2010/052405 mailed Jun. 23, 2011.
Search Report from International Serial No. PCT/US2003/010320 mailed Sep. 29, 2003.
Supplementary European Search Report from European Serial No. 03716979.4 mailed Jun. 7, 2006.
Taskin, Baris et al., "Timing-Driven Physical Design for VLSI Circuits Using Resonant Rotary Clocking," 49th IEEE International Midwest Symposium on Circuits and Systems, pp. 261-265, Aug. 6, 2006.

* cited by examiner

ARCHITECTURE FOR CONTROLLING CLOCK CHARACTERISTICS

CLAIM OF PRIORITY AND RELATED APPLICATIONS

This patent application is a conversion of and claims priority to U.S. Provisional Patent Application No. 61/250,830, entitled SYSTEMS AND METHODS FOR RESONANT CLOCKING INTEGRATED CIRCUITS, filed Oct. 12, 2009, which is incorporated herein in its entirety. This patent application is related to the technologies described in the following patents and applications, all of which are incorporated herein in their entireties:

U.S. patent application Ser. No. 12/125,009, entitled RESONANT CLOCK AND INTERCONNECT ARCHITECTURE FOR DIGITAL DEVICES WITH MULTIPLE CLOCK NETWORKS, filed Oct. 12, 2009, which claims priority to U.S. Provisional Patent Application No. 60/931,582, entitled RESONANT CLOCK AND INTERCONNECT ARCHITECTURE FOR PROGRAMMABLE LOGIC DEVICES, filed May 23, 2007;

U.S. patent application Ser. No. 12/903,154, entitled RESONANT CLOCK DISTRIBUTION NETWORK ARCHITECTURE WITH PROGRAMMABLE DRIVERS, filed Oct. 12, 2010;

U.S. patent application Ser. No. 12/903,163, entitled METHOD FOR SELECTING NATURAL FREQUENCY IN RESONANT CLOCK DISTRIBUTION NETWORKS WITH NO INDUCTOR OVERHEAD, filed Oct. 12, 2010;

U.S. patent application Ser. No. 12/903,166, entitled ARCHITECTURE FOR ADJUSTING NATURAL FREQUENCY IN RESONANT CLOCK DISTRIBUTION NETWORKS, filed Oct. 12, 2010;

U.S. patent application Ser. No. 12/903,168, entitled ARCHITECTURE FOR FREQUENCY-SCALED OPERATION IN RESONANT CLOCK DISTRIBUTION NETWORKS, filed Oct. 12, 2010;

U.S. patent application Ser. No. 12/903,172, entitled ARCHITECTURE FOR SINGLE-STEPPING IN RESONANT CLOCK DISTRIBUTION NETWORKS, filed Oct. 12, 2010;

U.S. patent application Ser. No. 12/903,174, entitled ARCHITECTURE FOR OPERATING RESONANT CLOCK NETWORK IN CONVENTIONAL MODE, filed Oct. 12, 2010; and U.S. patent application Ser. No. 12/903,188, entitled RESONANT CLOCK DISTRIBUTION NETWORK ARCHITECTURE FOR TRACKING PARAMETER VARIATIONS IN CONVENTIONAL CLOCK DISTRIBUTION NETWORKS filed Oct. 12, 2010.

FIELD OF INVENTION

This disclosure relates generally to clock distribution network architectures for digital devices with multiple clock networks and various clock frequencies such as microprocessors, application-specific integrated circuits (ASICs), and System-on-a-Chip (SOC) devices.

BACKGROUND OF THE INVENTION

Clock distribution networks are key elements of digital semiconductor devices. Clock signals are used to synchronize the operations performed in these devices and are typically distributed to thousands of clocked elements in the design. The characteristics of the clock waveform (for example, rise times of the clock edges, peak amplitude attained by the clock waveform, distance from power/ground rails, etc.) are critical to the overall performance of the device, as they determine the speed at which the clocked storage elements store data or propagate data to their outputs. As a consequence, significant design effort is expended on clock distribution networks, to ensure that clock waveforms conform to their specified characteristics. Furthermore, clock distribution networks tend to be significant sources of energy consumption in high-performance designs, as they usually include over-sized devices to ensure that they conform to their specified characteristics under all anticipated variations of fabrication and operational conditions. Consequently, in designs where it is desirable to minimize energy consumption, the design of clock distribution networks is especially challenging, because reductions in energy consumption of the clock distribution network will tend to negatively impact the ability of the clock distribution network to attain its specified characteristics.

Traditionally, a clock distribution network comprises a number of clock buffers that are used to propagate a reference clock signal from a single root point to multiple clocked storage elements. These clock buffers are supplied with power from the same power supply grid as the other circuitry in the device, and therefore, they operate at the same voltage level as the other circuitry. The arrival times of the clock signal to the storage elements are controlled by a variety of means, but generally at least in part by sizing the buffers so that the propagation delays of the various paths from the root to the storage elements are approximately equal. In addition to controlling the propagation delays of paths from the root to the storage elements, however, the sizing of the individual buffers is used to control the rise times of the clock signals as they are seen by the storage elements. In particular, the sizes of the buffers are typically made large enough to insure that the rise times and fall times of these clock signals cannot exceed a certain upper bound, because many types of storage elements will not attain their specified performance characteristics if the rise and/or fall times are too long.

In addition to the network of buffers, the system that supplies power to the buffers must also be considered as part of the overall clock distribution system. In most devices, the reference clock is distributed across the design to a set of final clock buffers, whose elements drive bufferless all-metal networks that deliver a clock signal directly to the inputs of storage elements; i.e., the last stage of buffers in the distribution network. These final buffers are typically large and draw large amounts of current within a relatively small window of time. These large current draws over a small time window can overwhelm the ability of the device's power-supply system, and cause variations in the voltage supplied to the final drivers, negatively impacting their performance. Moreover, since the final drivers typically share the power-supply system with other parts of the overall device, any variations in voltage that they cause will affect the operation of other parts of the device, and have additional negative impacts. As a consequence, ensuring that components of the clock-distribution network receive a stable power voltage, and in addition, ensuring that these components do not compromise the power voltage supplied to other parts of the overall device is an important part of the clock distribution network design effort.

Energy consumption in clock distribution networks can generally be reduced with the same methods as other circuitry in a design. For example, the energy consumption of other circuitry can be reduced by reducing the voltage of the power supplied to the circuitry. Similarly, by reducing the voltage supplied to the buffers in the clock distribution network, the energy consumption of the network can be reduced as well. Energy consumption of other circuitry can also be reduced by using smaller transistors to implement the circuitry, and similarly, by reducing the sizes of the transistors that implement the buffers of the clock distribution network, energy consumption of the clock distribution network can be reduced as well. Unfortunately, reduction of the voltage supplied to the clock distribution network buffers and reduction of the sizes of the transistors used to implement the buffers will have a negative impact on the ability of the network to realize suitable rise and/or fall times. Longer rise and/or fall times will generally have a negative impact on the performance of the storage elements that use the clock signal. Moreover, since a reduction in the power-voltage supplied to the buffers will typically directly translate into a reduction in the peak-to-peak "swing" of the voltage of the clock signal itself, the performance of the storage elements that use the clock signal will further be negatively impacted.

Given the sometimes large amount of energy consumed by clock distribution networks, and the secondary impact of their performance on the performance of the various storage elements in a device, it can be desirable to be able to control the operation of the clock distribution network independently from the operation of the other parts of a device. For example, in some contexts, it can be desirable to operate other parts of a device with a very low power-voltage supply, in order to drastically reduce energy consumption. However, if the clock buffers are on the same supply grid as the other circuitry in the device, the peak-to-peak voltage swing of the clock signal and rise and/or fall times of the clock signal may be so compromised by the low power-voltage, that performance of the storage elements using the clock will be too poor to be practical. In a situation such as this, it would be desirable to decouple the supply of the clock distribution network from the supply of other circuitry by dedicating to it a separate supply grid. Such a separate supply grid would traditionally need to be distributed across the entire design, however, due to the distributed nature of the buffers in the distribution network, and thus, represents an amount of additional metal-interconnection resources that is not practical in many designs.

Resonant clock distribution networks have been proposed for the energy-efficient distribution of clock signals in synchronous digital systems. In these networks, energy-efficient operation is achieved using one or more inductors to resonate the parasitic capacitance of the clock distribution network. Clock distribution with extremely low jitter is achieved through the reduction in the number of clock buffers. Moreover, extremely low skew is achieved among the distributed clock signals through the design of relatively symmetric all-metal distribution networks. Overall network performance depends on operating speed and total network inductance, resistance, size, and topology, with lower-resistance symmetric networks resulting in lower jitter, skew, and energy consumption when designed with adequate inductance.

Architectures for resonant clock distribution networks have been described and empirically evaluated in several articles, including "A 225 MHz Resonant Clocked ASIC Chip," by Ziesler C., et al., International Symposium on Low-Power Electronic Design, August 2003; "Energy Recovery Clocking Scheme and Flip-Flops for Ultra Low-Energy Applications," by Cooke, M., et al., International Symposium on Low-Power Electronic Design, August 2003; and "Resonant Clocking Using Distributed Parasitic Capacitance," by Drake, A., et al., Journal of Solid-State Circuits, Vol. 39, No. 9, September 2004; "900 MHz to 1.2 GHz two-phase resonant clock network with programmable driver and loading," by Chueh J.-Y., et al., IEEE 2006 Custom Integrated Circuits Conference, September 2006; "A 1 GHz filter with distributed resonant clock generator," by Sathe V., et al., IEEE Symposium on VLSI Circuits, June 2007; "A 0.8-1.2 GHz frequency tunable single-phase resonant-clocked FIR filter," by Sathe V., et al., IEEE 2007 Custom Integrated Circuits Conference, September 2007; "A Resonant Global Clock Distribution for the Cell Broadband Engine Processor," by Chan S., et al., IEEE Journal of Solid State Circuits, Vol. 44, No. 1, January 2009. Throughout these articles, driver sizing and duty cycle adjustment are used to minimize the amount of energy required to keep the resonant clock network swinging at the peak-to-peak power-voltage that would be realized by a traditional clock distribution network of buffers.

A hitherto unexploited characteristic of resonant clock distribution networks is that sizing of the resonant clock drivers and/or adjustment of the duty cycle of the reference clock will have an effect on the amplitude of the clock signal, without requiring the distribution of a separate voltage supply level. Consequently, by adjusting the size of the resonant clock drivers or the duty cycle of the reference clock in resonant clock networks, peak-to-peak clock levels can be made to be higher or lower than the voltage supplied to the other circuitry in the device, enabling higher performance at a given supply level, or higher energy efficiency at a given performance level. Specifically, for a given supply level, it is possible to operate the clock at a higher peak level, resulting in faster operation of the clocked storage elements and, therefore, faster operation of the device. Similarly, for a target performance level, it is possible to run the clock at a higher amplitude than the voltage supplied to the other circuitry, resulting in faster operation of the clocked storage elements, and thus, enabling further reduction in the voltage supply of the other circuitry. Moreover, unlike the distributed locations of clock buffers traditionally seen in non-resonant clock distribution networks, the locations of clock drivers in resonant clock distribution networks can be centralized at the locations of the requisite inductor elements, thereby avoiding the need for distributed-control solutions for the dynamic adjustment of clock driver sizing and/or duty-cycle of the reference clock.

In all prior art references, driver sizing and duty cycle adjustment are explored in the limited context of energy efficiency in the resonant clock network itself. They are not used to control clock rise and/or fall times or clock amplitude. Moreover, they are not used to impact overall power consumption in the device by operating the clock signal at a higher or lower voltage than the other circuitry in the device, with the objective of achieving higher performance at a target voltage level, or lower energy consumption at a target performance level.

Overall, the examples herein of some prior or related systems and their associated limitations are intended to be illustrative and not exclusive. Other limitations of existing or prior systems will become apparent to those of skill in the art upon reading the following Detailed Description.

SUMMARY OF THE DESCRIPTION

An architecture for controlling the clock waveform characteristics, including but not limited to the clock amplitude and clock rise and/or fall times, of resonant clock distribution networks is proposed. This architecture relies on controlling the size of clock drivers and the duty cycles of reference clocks. It is generally applicable to semiconductor devices with multiple clock frequencies, and high-performance and low-power clocking requirements such as microprocessors, ASICs, and SOCs. In some embodiments, the architecture can be realized with no need for routing additional power grids or additional control signals to clock-distribution network components whose physical locations are not centralized in the vicinity of the inductive elements of the resonant clock distribution network.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Other advantages and features will become apparent from the following description and claims. It should be understood that the description and specific examples are intended for purposes of illustration only and not intended to limit the scope of the present disclosure.

BRIEF DESCRIPTION OF DRAWINGS

These and other objects, features and characteristics of the present invention will become more apparent to those skilled in the art from a study of the following detailed description in conjunction with the appended claims and drawings, all of which form a part of this specification. In the drawings:

Figure 1:
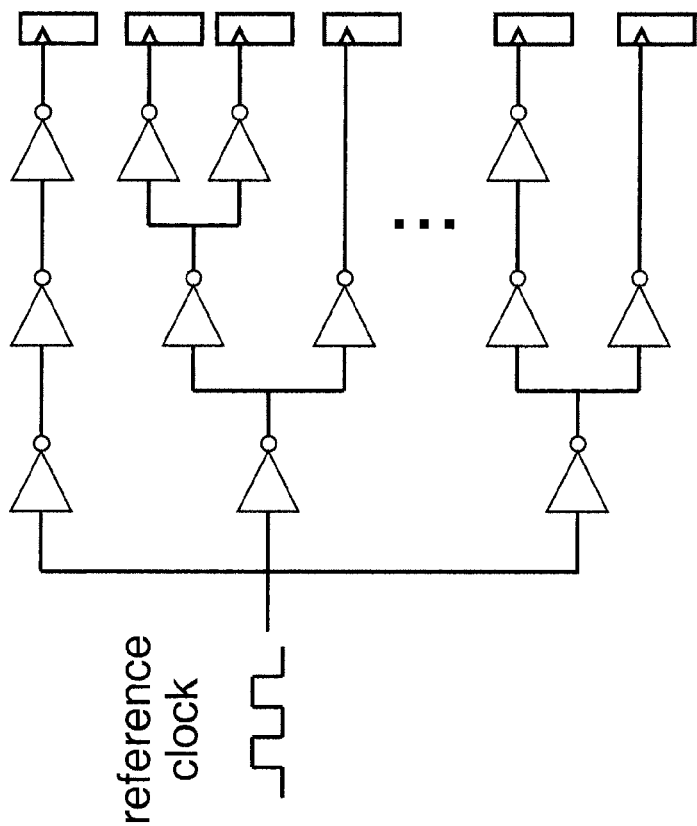
FIG. 1 illustrates a typical architecture of a conventional buffered clock distribution network.

The headings provided herein are for convenience only and do not necessarily affect the scope or meaning of the claimed invention.

In the drawings, the same reference numbers and any acronyms identify elements or acts with the same or similar structure or functionality for ease of understanding and convenience. To easily identify the discussion of any particular element or act, the most significant digit or digits in a reference number refer to the Figure number in which that element is first introduced (e.g., element 204 is first introduced and discussed with respect to FIG. 2).

DETAILED DESCRIPTION OF THE INVENTION

Various examples of the invention will now be described. The following description provides specific details for a thorough understanding and enabling description of these examples. One skilled in the relevant art will understand, however, that the invention may be practiced without many of these details. Likewise, one skilled in the relevant art will also understand that the invention can include many other obvious features not described in detail herein. Additionally, some well-known structures or functions may not be shown or described in detail below, so as to avoid unnecessarily obscuring the relevant description.

The terminology used below is to be interpreted in its broadest reasonable manner, even though it is being used in conjunction with a detailed description of certain specific examples of the invention. Indeed, certain terms may even be emphasized below; however, any terminology intended to be interpreted in any restricted manner will be overtly and specifically defined as such in this Detailed Description section.

FIG. 1 shows a conventional network for distributing a reference clock signal to multiple clocked elements such as flip-flops and clock gaters. In this network, a collection of buffers is used to propagate a reference clock signal that is supplied at the root of the network to multiple clocked elements throughout a semiconductor device. The propagation delays of the paths from the root to the clocked elements are generally balanced, for example, so that the clock signal arrives at all these elements at approximately the same time. Propagation delays are controlled by adjusting the size of the buffers along the paths. The size of these buffers also determine the rise times of the clock signals, that is, the amount of time required for the clock signal to rise from 10% of its peak value to 90% of its peak value. Clock rise times are critical for overall device performance, as they determine the speed at which data are stored into clocked storage elements, and the speed at which data propagate to the outputs of clocked storage elements.

Figure 2:
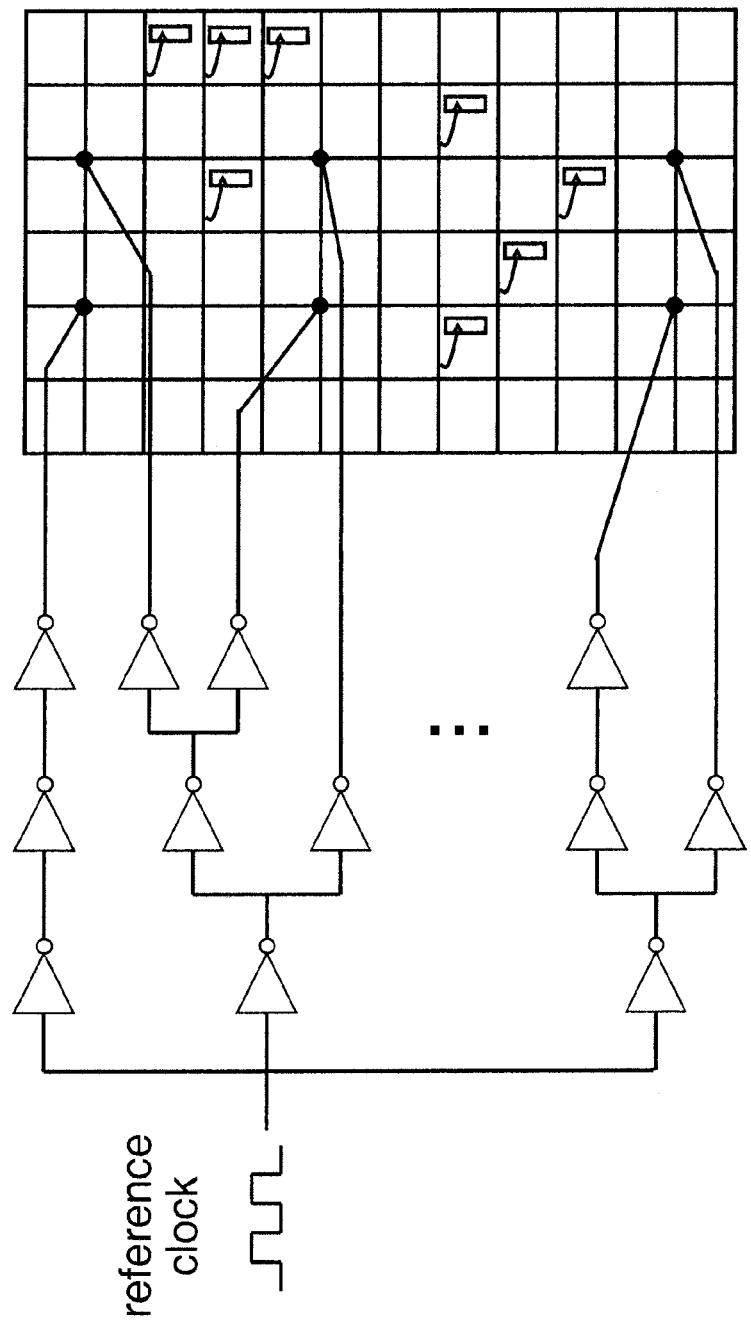
FIG. 2 illustrates a typical architecture of a conventional buffered clock distribution network in which the final buffers drive an all-metal mesh.

Typically, power is supplied to the clock buffers through the same grid that is used to supply power to the other circuitry in the device. Therefore, the peak amplitude of the clock signal is typically equal to that of any other signal in the design. In the case of high-performance devices, particular care is devoted to ensuring that clock buffers are supplied with as stable a voltage level as possible. In these devices, the reference clock is distributed across the entire design to a set of final clock buffers (or drivers), that is the last stage of buffers in the distribution network, which may in concert drive an all-metal mesh structure that delivers the clock signal to its final destinations. FIG. 2 illustrates such a clock distribution network. Typically, these final buffers are large and draw significant levels of current within a narrow time interval. To ensure a stable supply, and therefore a stable clock signal, large decoupling capacitors may be placed in the vicinity of the final buffers, so that their operation remains relatively unaffected by the current draw requirements of other circuitry.

Figure 3:
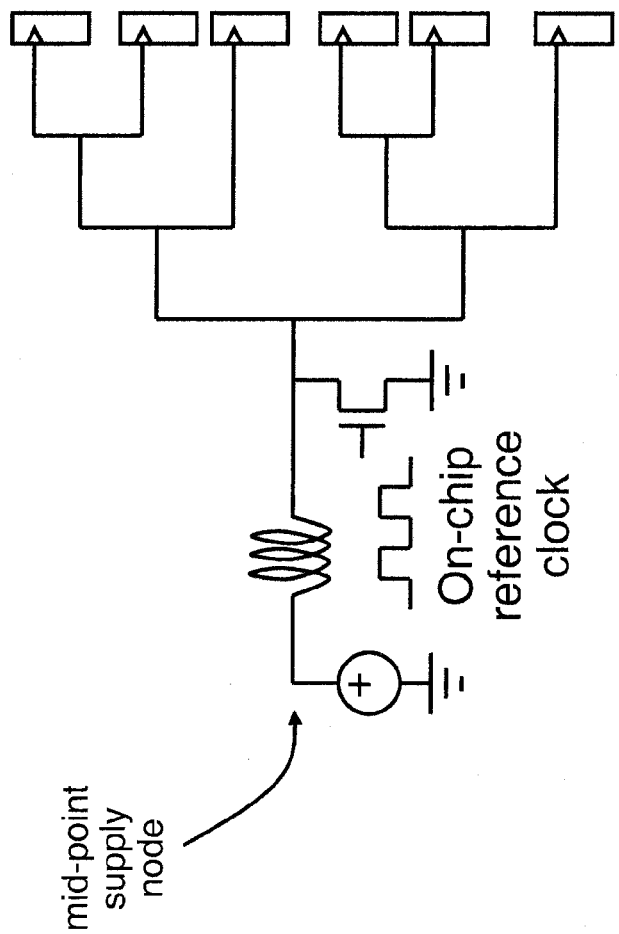
FIG. 3 illustrates a typical architecture of a resonant clock distribution network.

FIG. 3 depicts a resonant clock distribution network architecture for a semiconductor device. In this design, the buffered distribution network has been replaced by an all-metal distribution network. Typically, this all-metal network has an approximately symmetric topology, delivering the clock signal to the clocked elements (for example, flip-flops and clock gaters) of the semiconductor device with very low skew. The network includes a clock driver that is augmented by an inductor that provides additional drive strength with low energy consumption by resonating the parasitic capacitance of the load seen by the driver. The resulting combination of the buffer, inductor, and other ancillary circuitry is typically referred to as a resonant clock driver. In this figure, the final clock driver is an NMOS device that is driven by the reference clock signal, forcing the clock network to oscillate at the frequency of the reference clock. One terminal of the inductor is connected to the clock node, while the other terminal is connected to a supply node with voltage at approximately the mid-point of the clock signal oscillation. For example, if the clock signal oscillates between 0V and 1V, then the mid-point supply is approximately set to 0.5V.

Unlike the buffered clock distribution network of FIG. 1, the resonant clock distribution network in FIG. 3 has a single buffer at its root. Therefore, the rise time of the clock waveform can be controlled by adjusting the size of that single buffer, instead of requiring the adjustment of all the final buffers in the clock network. Moreover, unlike the buffered clock distribution network of FIG. 1, in which the amplitude of the clock signal is equal to the voltage supplied to the rest of the design, the amplitude of the resonant clock can be controlled by adjusting the size of the resonant clock driver, or by adjusting the duty cycle of the reference clock that drives it. Specifically, by increasing the size of the NMOS device, a larger current builds up in the inductor, storing a larger amount of energy in its surrounding magnetic field. When the NMOS device turns off, the increased magnetic field is transformed into a larger electric field on the clock capacitor, resulting in a voltage level that exceeds the supply level. Conversely, by decreasing the size of the NMOS device, the current through the inductor is limited, and the amplitude of the clock signal can be kept below the supply voltage for the rest of the circuitry. In a similar manner, the duty cycle of the reference clock can be used to build up more or less current in the inductor, resulting in clock amplitudes that are greater or less than the supply voltage. In a buffered clock distribution, control of the clock rise times is achieved by adjusting each one of the individual final buffers. Moreover, it is not possible to independently control the amplitude of the clock signal from the maximum level of the other signals in the device, unless a separate supply is provided to the clock buffers. In a resonant clock distribution network, it is possible to control the rise time and the amplitude of the control signal from a single point in the design, namely the resonant clock driver, without requiring an additional power supply network.

Figure 4:
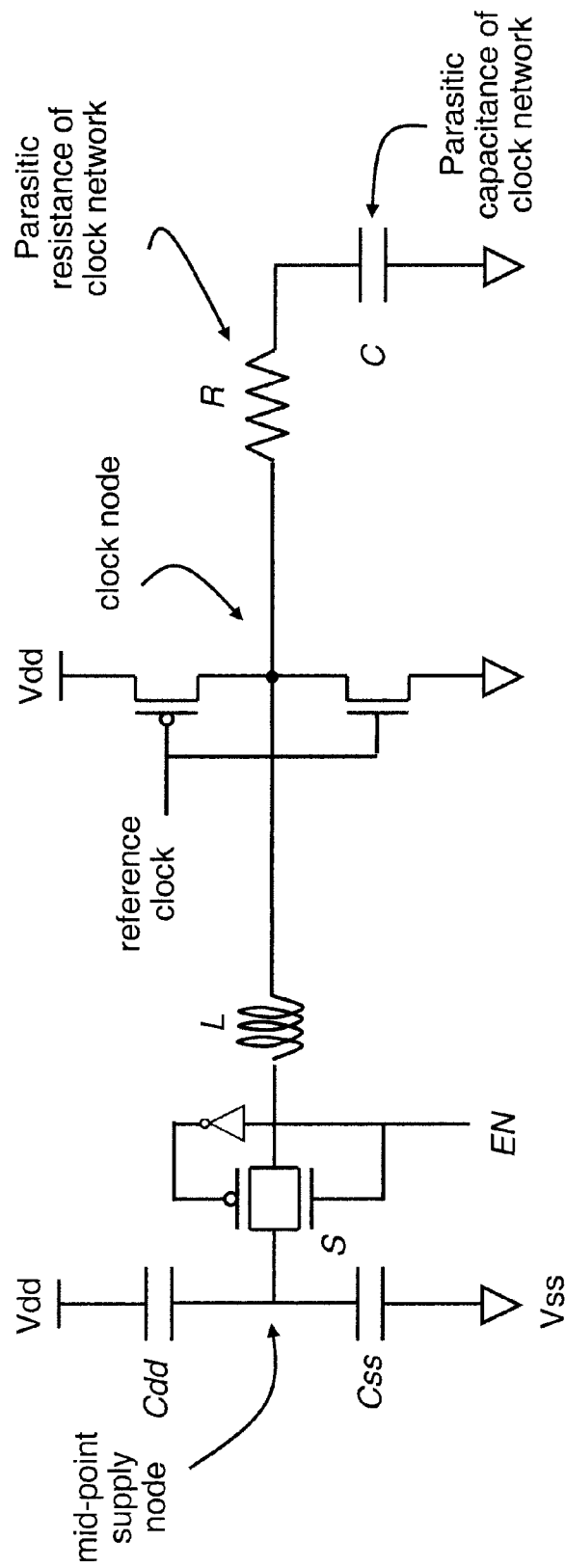
FIG. 4 illustrates a typical driver design for resonant clocking with the clock load modeled as a lumped capacitor.

FIG. 4 illustrates another embodiment of a resonant clock driver design, in which the clock distribution network is modeled as a lumped capacitor C in series with a lumped resistance R. This driver comprises a pull-up PMOS and a pull-down NMOS device for driving the clock. The PMOS device is connected between the clock node and the power supply terminal. The NMOS device is connected between the clock node and the ground terminal. Both devices are driven by the reference clock signal. An inductor L is connected between the clock node and the mid-point supply node. In the driver shown in this figure, the mid-point is implemented using two capacitors Cdd and Css. Capacitor Cdd is connected between the mid-point and the power supply terminal. Capacitor Css is connected between the mid-point and the ground terminal. To maximize energy savings, the value of the inductor is approximately chosen so that the LC tank set up by the inductor and the parasitic capacitance of the clock distribution network has a natural frequency that is approximately equal to the frequency of the reference clock signal. The switch S can be used to selectively decouple the inductor from the mid-point supply, thus providing the option of driving the clock network in non-resonant mode. When the control signal EN turns the switch on, the driver operates in resonant mode. When the switch is turned off, then the driver operates in non-resonant mode. In this figure, the switch is shown as a transmission gate.

Figure 5:
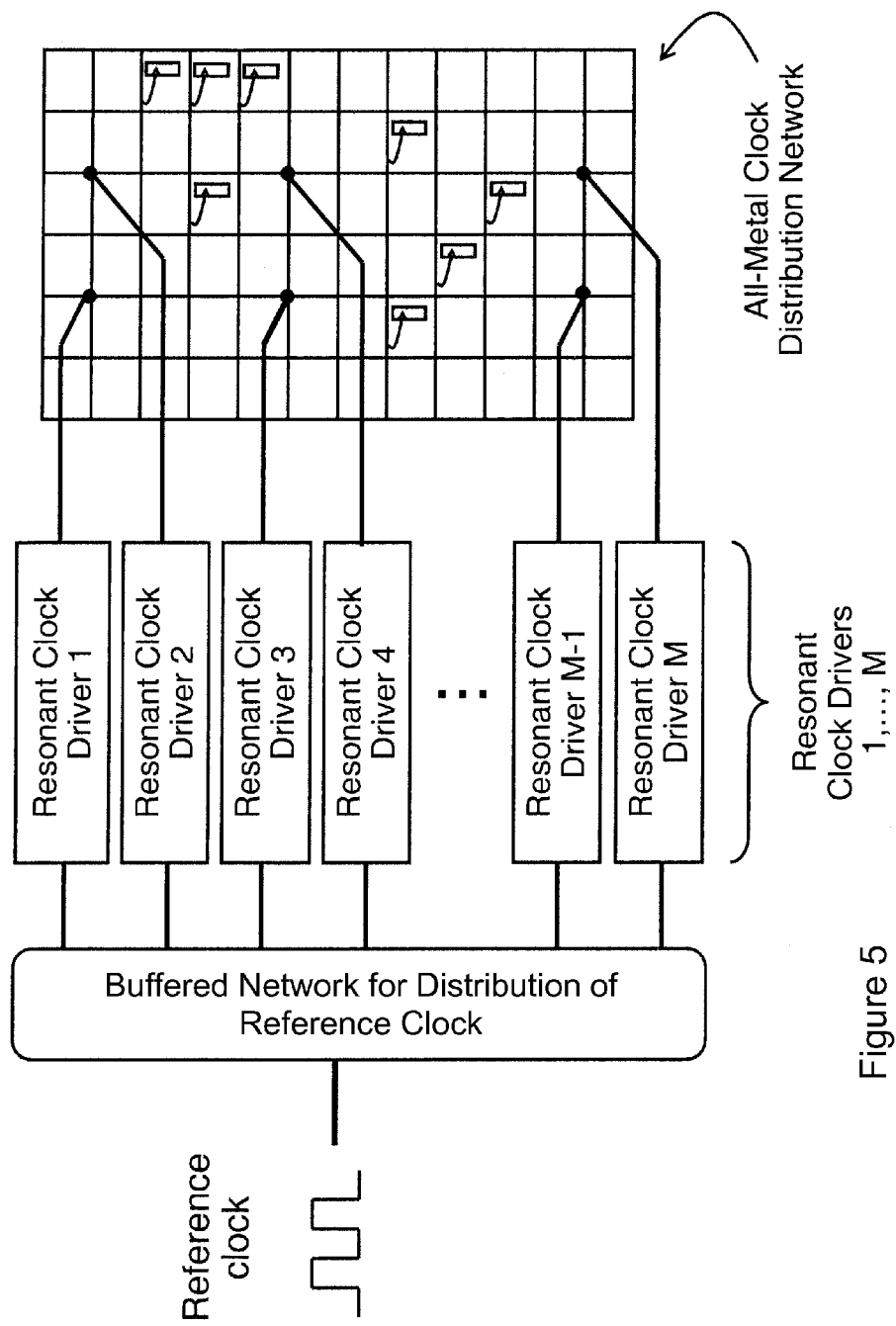
FIG. 5 illustrates a typical architecture of a resonant clock distribution network, in which multiple resonant clock drivers operate in parallel to drive a large all-metal mesh.

For large clock loads, multiple resonant clock drivers are typically combined in parallel, as illustrated in FIG. 5. In this embodiment, the reference clock is distributed to the resonant clock drivers using a buffered distribution network. The resonant clock drivers are operated in parallel, driving the all-metal mesh to oscillate at the same frequency as the reference clock.

Figure 6:
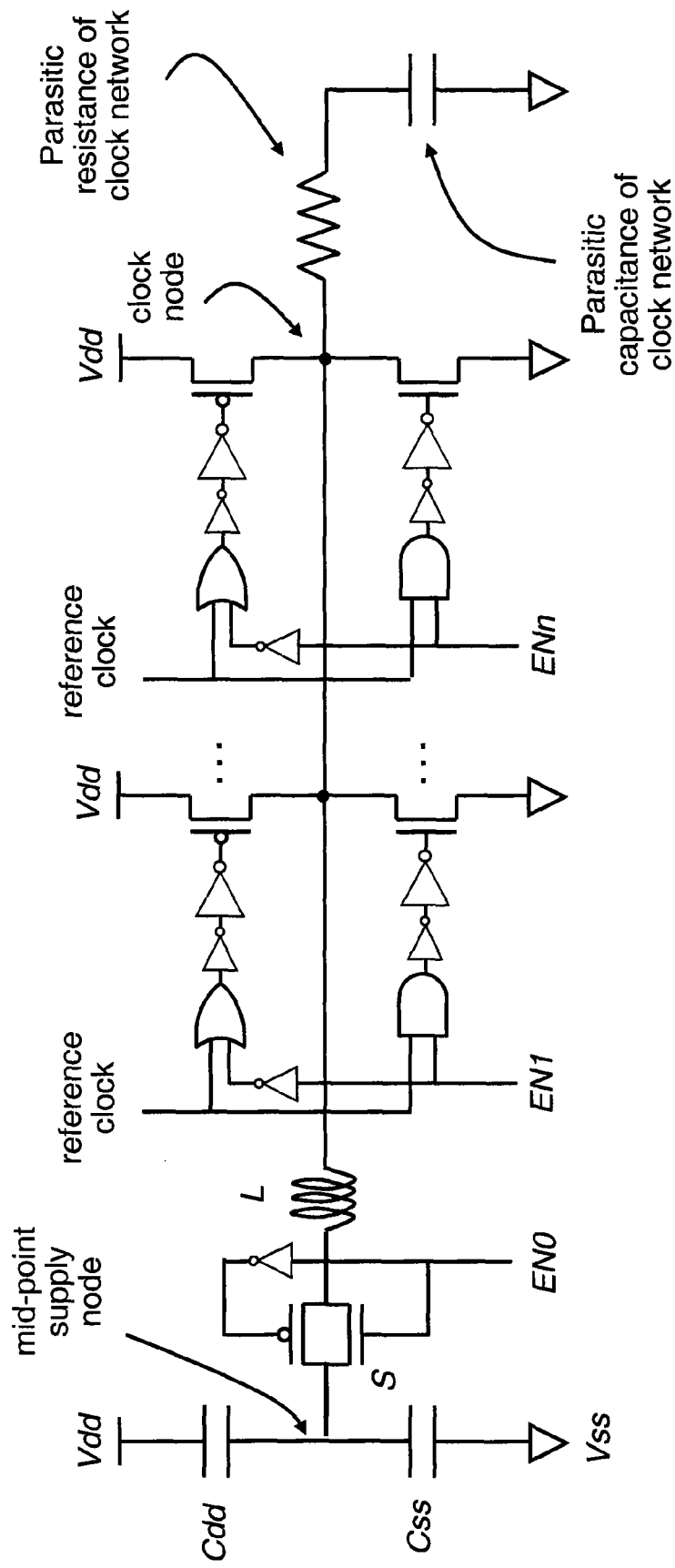
FIG. 6 illustrates an embodiment of a resonant clock driver in the proposed architecture for controlling the characteristics of the resonant clock waveform by selectively enabling drivers of the clock node.

FIG. 6 shows an embodiment of the proposed architecture for controlling the characteristics of a clock waveform from a centralized point. In this embodiment, the resonant clock driver comprises a collection of NMOS and PMOS devices that can be selectively activated using control signals EN1, . . . , ENn. By increasing the size of the resonant driver, an increased current can be supplied to the resonant clock network, resulting in decreased rise time or increased clock amplitude. Conversely, by decreasing the size of the resonant clock driver, the current supplied to the resonant clock network decreases, resulting in increased rise time, or decreased clock amplitude. This control function is accomplished by adjustments that can occur at a centralized location within the resonant clock driver. Moreover, it can be accomplished without requiring a separate supply network for the driver. Note that in systems like that shown in FIG. 5, where multiple resonant clock drivers are employed, each resonant clock driver may have its driver size adjusted independently, in order to accommodate variation in the clock load presented by the local part of the overall clock network.

Figure 7:
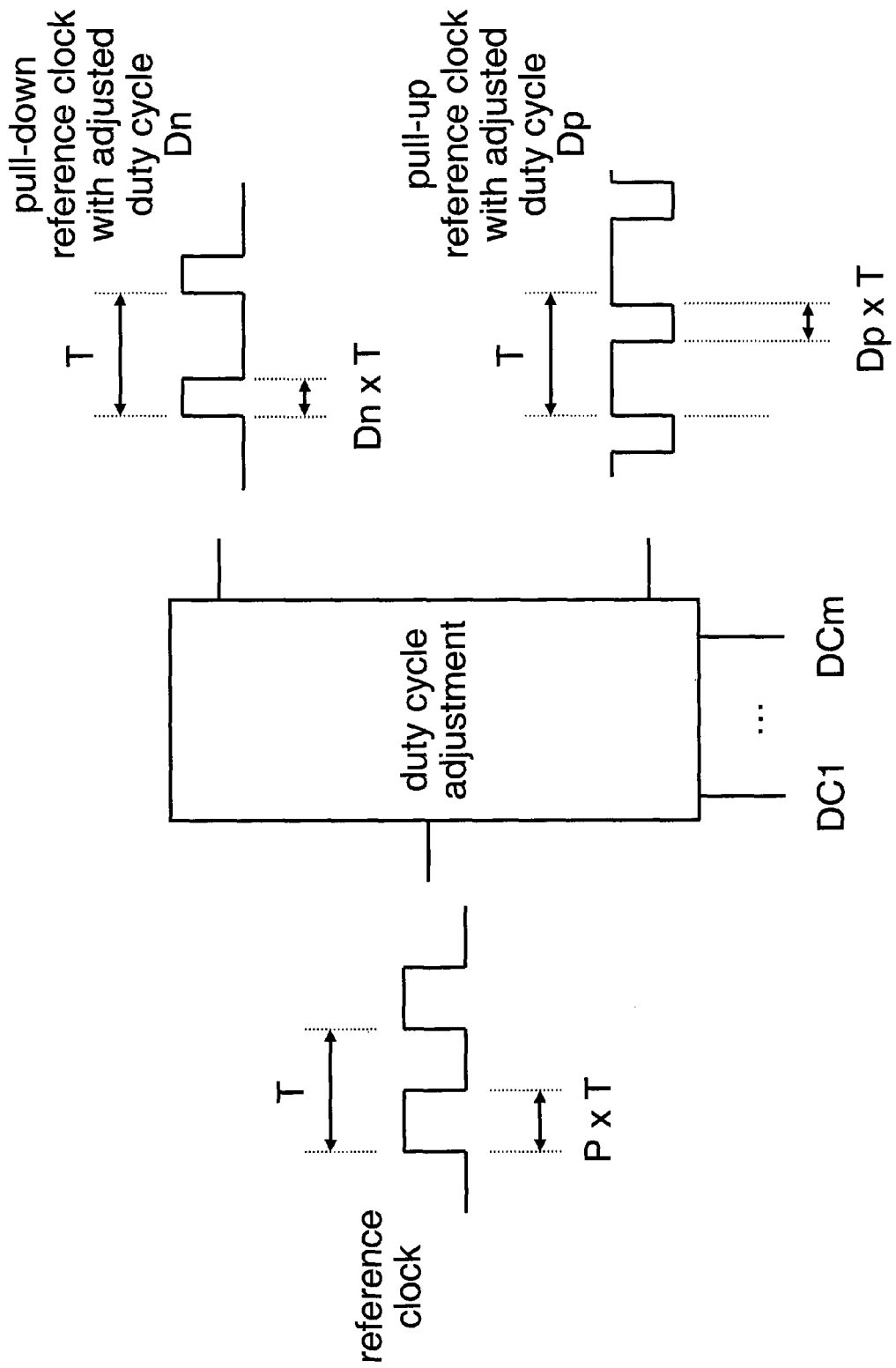
FIG. 7 illustrates the derivation of reference clock signals with various duty cycles from a reference clock signal with a given duty cycle.

FIG. 7 shows another aspect of the proposed approach. In particular, the duty cycle of the reference clock signal (time at high level divided by clock period) can determine the amount of energy supplied to the resonant clock network, thus affecting the rise time or the amplitude of the clock waveform. By adjusting the duty cycle of the reference clock signal separately for the pull-up and for the pull-down drivers, it is possible to control rise time and amplitude from the centralized location of the resonant clock driver. As in the case of diver size adjustment, systems like that shown in FIG. 5, where multiple resonant clock drivers are employed, each resonant clock driver may have the duty cycle of its reference clock adjusted independently, in order to accommodate variation in the clock load presented by the local part of the overall clock network. In general, the reference clock may have an arbitrary duty cycle P<1. The duty cycles Dn (time at high level divided by clock period) and Dp (time at low level divided by clock period) of the two derivative reference clocks are determined so that the amount of energy injected into the resonant clock network each clock cycle is sufficient to accommodate variation in the local clock load or meet a target clock rise and/or fall time, or a target clock amplitude. In general, the derivative reference clocks may have arbitrary duty cycles Dn and Dp that are not necessarily equal to each other. The programmable duty cycle adjustment box generates the two reference clocks with adjusted duty cycles Dn and Dp in accordance with the values of the control bits DC1, . . . , DCm.

Figure 8:
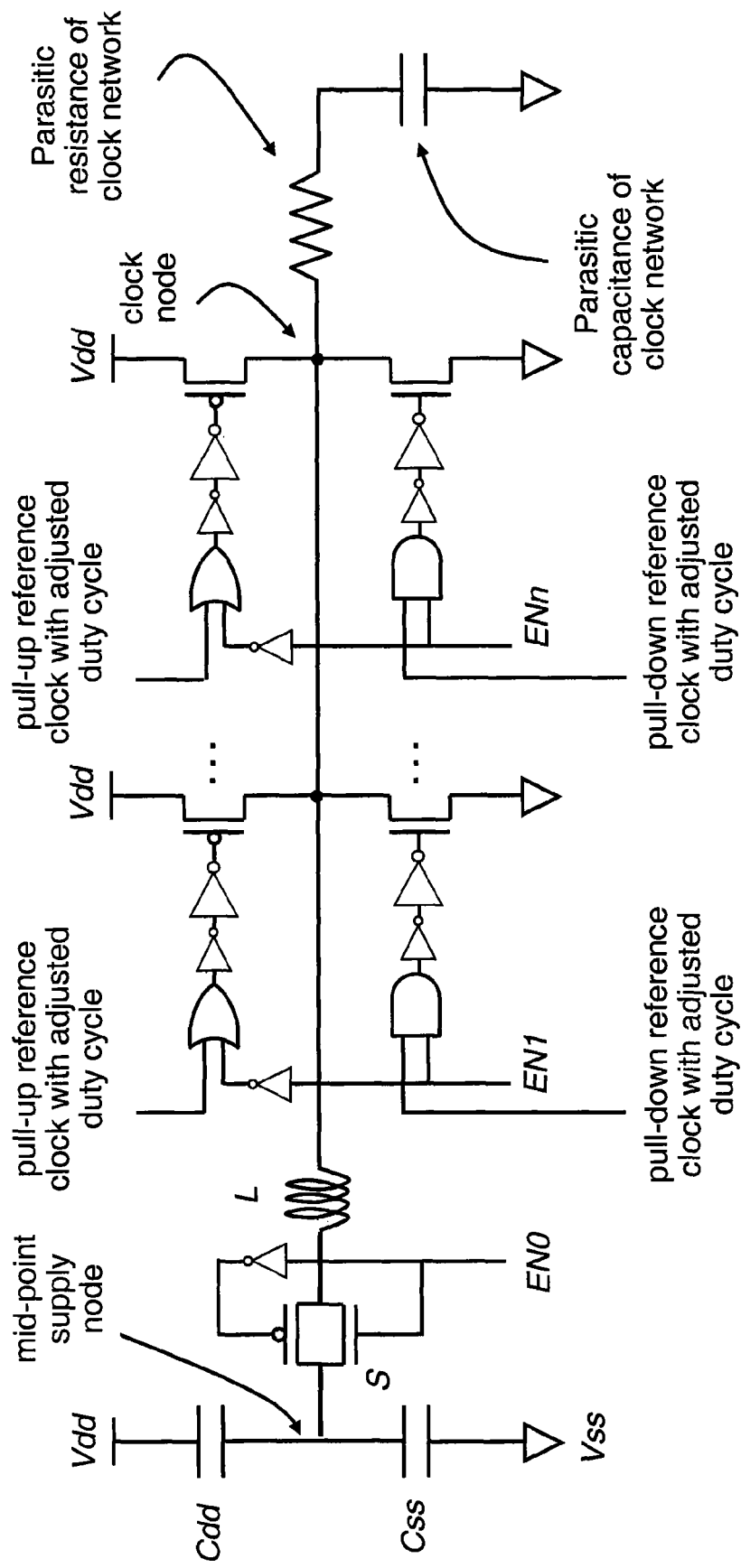
FIG. 8 illustrates an embodiment of a resonant clock driver in the proposed architecture for controlling the characteristics of the resonant clock waveform by adjusting the size of the drivers and the duty cycle of the reference clocks.

FIG. 8 shows a preferred embodiment for a resonant clock driver that can be used to control the characteristics of a clock waveform through adjustment of the final driver size or through adjustment of the duty cycle of the reference clocks that drive the pull-up and pull-down devices in the driver.

Figure 9:
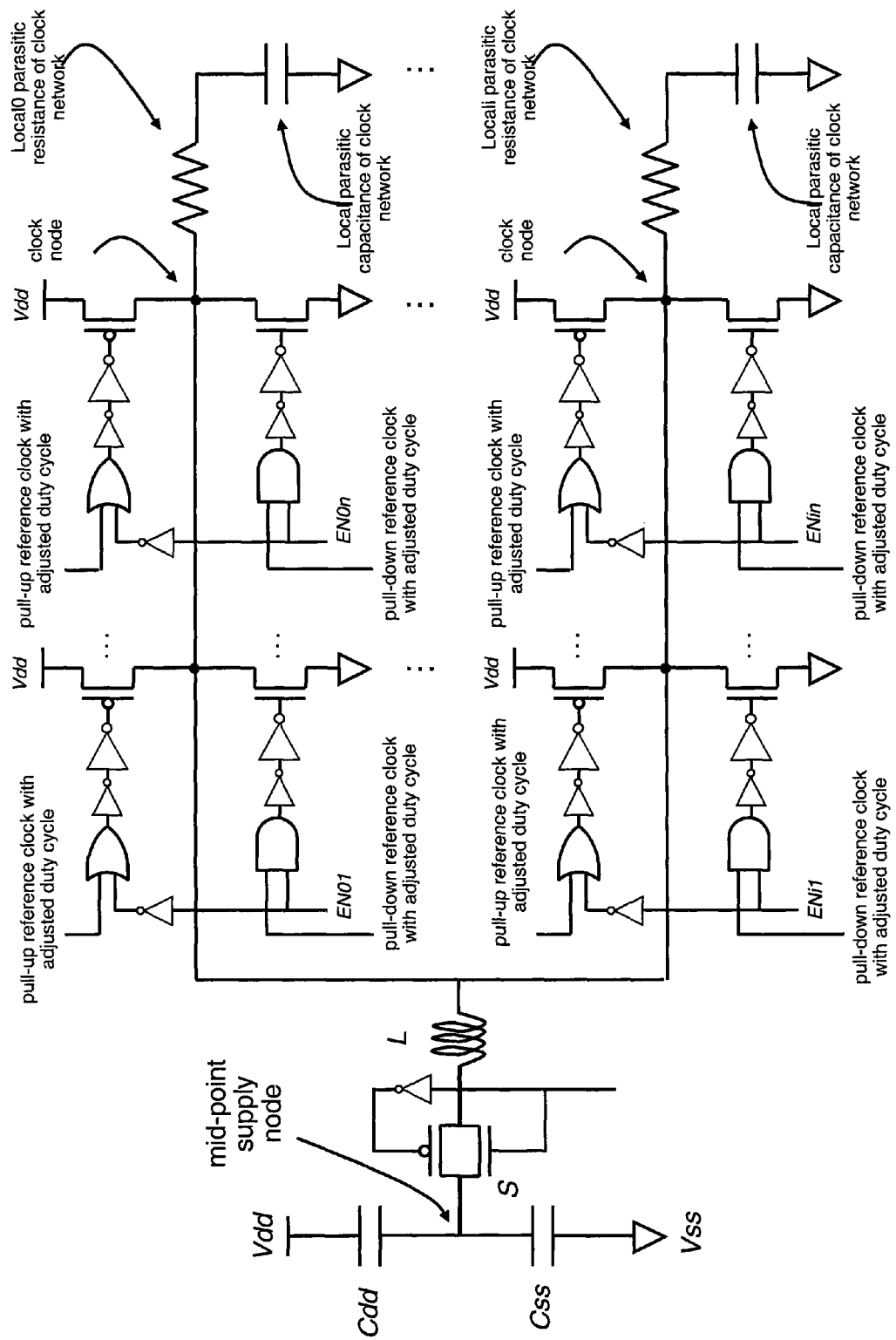
FIG. 9 shows an exemplary embodiment of a driver in the proposed architecture for controlling the characteristics of the resonant clock waveform by adjusting the size of the drivers and the duty cycle of the reference clocks, but where the sizes and duty cycles of the reference clocks are independently adjusted for multiple sub-drivers, to account for variations in load over the resonant-clock distribution network.

FIG. 9 shows a preferred embodiment for a resonant clock driver in the proposed architecture for controlling the characteristics of the resonant clock waveform by adjusting the size of the drivers and the duty cycle of the reference clocks, but where the sizes and duty cycles of the reference clocks are independently adjusted for multiple sub-drivers, to account for variations in load over the resonant-clock distribution network.

Unless the context clearly requires otherwise, throughout the description and the claims, the words "comprise," "comprising," and the like are to be construed in an inclusive sense (i.e., to say, in the sense of "including, but not limited to"), as opposed to an exclusive or exhaustive sense. As used herein, the terms "connected," "coupled," or any variant thereof means any connection or coupling, either direct or indirect, between two or more elements. Such a coupling or connection between the elements can be physical, logical, or a combination thereof. Additionally, the words "herein," "above," "below," and words of similar import, when used in this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above Detailed Description of examples of the invention is not intended to be exhaustive or to limit the invention to the precise form disclosed above. While specific examples for the invention are described above for illustrative purposes, various equivalent modifications are possible within the scope of the invention, as those skilled in the relevant art will recognize. While processes or blocks are presented in a given order in this application, alternative implementations may perform routines having steps performed in a different order, or employ systems having blocks in a different order. Some processes or blocks may be deleted, moved, added, subdivided, combined, and/or modified to provide alternative or sub-combinations. Also, while processes or blocks are at times shown as being performed in series, these processes or blocks may instead be performed or implemented in parallel, or may be performed at different times. Further any specific numbers noted herein are only examples. It is understood that alternative implementations may employ differing values or ranges.

The various illustrations and teachings provided herein can also be applied to systems other than the system described above. The elements and acts of the various examples described above can be combined to provide further implementations of the invention.

Any patents and applications and other references noted above, including any that may be listed in accompanying filing papers, are incorporated herein by reference. Aspects of the invention can be modified, if necessary, to employ the systems, functions, and concepts included in such references to provide further implementations of the invention.

These and other changes can be made to the invention in light of the above Detailed Description. While the above description describes certain examples of the invention, and describes the best mode contemplated, no matter how detailed the above appears in text, the invention can be practiced in many ways. Details of the system may vary considerably in its specific implementation, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention under the claims.

While certain aspects of the invention are presented below in certain claim forms, the applicant contemplates the various aspects of the invention in any number of claim forms. For example, while only one aspect of the invention is recited as a means-plus-function claim under 35 U.S.C. §112, sixth paragraph, other aspects may likewise be embodied as a means-plus-function claim, or in other forms, such as being embodied in a computer-readable medium. (Any claims intended to be treated under 35 U.S.C. §112, ¶ 6 will begin with the words "means for.") Accordingly, the applicant reserves the right to add additional claims after filing the application to pursue such additional claim forms for other aspects of the invention.

We claim:

1. A clock driver of a clock distribution network for generating a resultant clock signal to be supplied to a circuit block, the clock driver comprising:
    a plurality of drive elements electrically coupled to a clock node of the clock driver, each of the plurality of drive elements configured to receive and propagate a reference clock of the clock distribution network;
    a pre-adjustment module operably coupled between inputs of the plurality of drive elements and a signal generator that generates the reference clock, the pre-adjustment module configured to adjust a duty cycle of the reference clock supplied to the plurality of drive elements so as to adjust a final value of an amplitude, a rise time, and/or a fall time of the resultant clock signal; and
    a resonance element operably coupled to the clock node, wherein the resonance element is configured to resonate at a specified frequency to boost an overall drive strength of the resultant clock signal.

2. The clock driver of claim 1, further comprising:
    a resonance switch operably connected to the resonance element, wherein the resonance switch enables the resonance element to be enabled or disabled, causing the clock driver to operate respectively in a resonant mode or a non-resonant mode.

3. The clock driver of claim 1, wherein each of the plurality of drive elements is configured to be selectively enabled by a corresponding enable signal.

4. The clock driver of claim 3, wherein the enable signal for each of the plurality of drive elements is supplied via a pre-driver circuit setup.

5. The clock driver of claim 1, wherein each of the plurality of drive elements includes a pull-up element and a pull-down element.

6. The clock driver of claim 5, wherein the pre-adjustment module further comprises:
    a pull-up pre-adjustment module operably coupled between an input of the pull-up element of each of the plurality of drive elements and the signal generator, the pull-up pre-adjustment module configured to adjust a first duty cycle of the reference clock supplied to the pull-up element of each of the plurality of drive elements; and
    a pull-down pre-adjustment module operably coupled between an input of the pull-down element of each of the plurality of drive elements and the signal generator, the pull-down pre-adjustment module configured to adjust a second duty cycle of the reference clock supplied to the pull-down element of each of the plurality of drive elements.

7. A clock distribution network for an integrated circuit, the clock distribution network comprising:
 a signal generator configured to generate a reference clock;
 a plurality of clock drivers, each of the plurality of clock drivers configured to receive the reference clock and generate a resultant clock signal to be supplied to a particular circuit block of the integrated circuit; and
 a plurality of pre-adjustment modules, each of the plurality of pre-adjustment modules operably coupled between the signal generator and one of the plurality of clock drivers, the pre-adjustment module associated with a given clock driver configured to adjust a duty cycle of the reference clock supplied to the given clock driver so as to control a final value of an amplitude, a rise time, and/or a fall time of the resultant clock signal generated by the given clock driver;
 wherein each of the plurality of clock drivers includes a resonance element, wherein the resonance element is configured to resonate at a specified frequency to boost an overall drive strength of the resultant clock signal.

8. The clock distribution network of claim 7, wherein each of the plurality of clock drivers includes a plurality of drive elements, the plurality of drive elements configured to receive and propagate the reference clock in order to generate the resultant clock signal.

9. The clock distribution network of claim 8, wherein each of the plurality of drive elements of at least one of the clock drivers is configured to be selectively enabled by a corresponding enable signal.

10. The clock distribution network of claim 7, further comprising:
 a resonance switch operably connected to the resonance element of each clock driver, wherein the resonance switch enables the resonance element to be enabled or disabled for a given clock driver, causing the given clock driver to operate respectively in a resonant mode or a non-resonant mode.

11. The clock distribution network of claim 10, wherein the enable signal for each of the plurality of drive elements of a given clock driver is supplied via a pre-driver circuit setup.

12. A method of operation of a clock driver of a clock distribution network, the method comprising:
 electrically coupling a plurality of drive elements to a clock node of the clock driver, each of the plurality of drive elements configured to receive and propagate a reference clock of the clock distribution network;
 operably coupling a pre-adjustment module between inputs of the plurality of drive elements and a signal generator that generates the reference clock;
 using the pre-adjustment module, selectively adjusting a duty cycle of the reference clock supplied to the plurality of drive elements so as to adjust a final value of an amplitude, a rise time, and/or a fall time of a resultant clock signal; and
 operably coupling a resonance element to the clock node, wherein the resonance element is configured to resonate at a specified frequency to boost an overall drive strength of the resultant clock signal.

13. The method of claim 12, further comprising:
 selectively enabling or disabling the resonance element causing the clock driver to operate respectively in a resonant mode or a non-resonant mode.

14. The method of claim 12, further comprising:
 selectively enabling or disabling each of the plurality of drive elements using a corresponding enable signal.

15. The method of claim 14, wherein the enable signal for each of the plurality of drive elements is supplied via a pre-driver circuit setup.

16. The method of claim 12, wherein each of the plurality of drive elements includes a pull-up element and a pull-down element.

17. The method of claim 16, wherein the pre-adjustment module further includes a pull-up pre-adjustment module operably coupled between an input of the pull-up element of each of the plurality of drive elements and the signal generator, and a pull-down pre-adjustment module operably coupled between an input of the pull-down element of each of the plurality of drive elements and the signal generator, the method further comprising:
 using the pull-up pre-adjustment module, selectively adjusting a first duty cycle of the reference clock supplied to the pull-up element of each of the plurality of drive elements; and
 using the pull-down pre-adjustment module, selectively adjusting a second duty cycle of the reference clock supplied to the pull-down element of each of the plurality of drive elements.

* * * * *